(12) United States Patent
Scollo et al.

(10) Patent No.: US 7,649,401 B2
(45) Date of Patent: Jan. 19, 2010

(54) DRIVING CIRCUIT FOR AN EMITTER-SWITCHING CONFIGURATION OF TRANSISTORS

(75) Inventors: Rosario Scollo, Misterbianco (IT); Massimo Nania, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/022,716

(22) Filed: Jan. 30, 2008

(65) Prior Publication Data

US 2008/0180158 A1 Jul. 31, 2008

(30) Foreign Application Priority Data

Jan. 30, 2007 (IT) .................. MI2007A000141

(51) Int. Cl.
*H03K 17/60* (2006.01)
(52) U.S. Cl. .................. 327/432; 327/108
(58) Field of Classification Search .......... 327/434, 327/110, 427
See application file for complete search history.

(56) References Cited

U.S. PATENT DOCUMENTS 4,866,313 A * 9/1989 Tabata et al. .......... 327/432
6,400,204 B1 * 6/2002 Davis .................. 327/314
2005/0258884 A1 * 11/2005 Wu .................... 327/307

FOREIGN PATENT DOCUMENTS

EP 1455452 A1 9/2004

* cited by examiner

*Primary Examiner*—Lincoln Donovan
*Assistant Examiner*—Daniel Rojas
(74) *Attorney, Agent, or Firm*—Lisa K. Jorgenson; Robert Iannucci; Seed IP Law Group PLLC (57) ABSTRACT

A driving circuit for an emitter-switching configuration of transistors having first and second control terminals connected to the driving circuit, forms a controlled emitter-switching device having in turn respective collector, source and gate terminals. The driving circuit comprises a driving block coupled between the collector terminal and the source terminal of the controlled emitter-switching device and connected to the first control terminal of the emitter-switching configuration. Further advantageously, the driving block comprises at least one IGBT driving device coupled between the collector terminal and the first control terminal of the emitter-switching configuration and having, in turn, a third control terminal, as well as a driving bipolar transistor, coupled between the collector terminal and the first control terminal of the emitter-switching configuration for controlling a saturation condition of said bipolar transistor of said emitter-switching configuration maintaining a base-collector junction thereof at a voltage next to zero and having, in turn, a fourth control terminal.

17 Claims, 8 Drawing Sheets

DRIVING CIRCUIT FOR AN EMITTER-SWITCHING CONFIGURATION OF TRANSISTORS

FIELD OF APPLICATION

The present invention relates to a driving circuit for an emitter-switching transistors configuration.

More specifically, the invention relates to a driving circuit for an emitter-switching configuration of transistors having at least one first and one second control terminal connected to said driving circuit to form a controlled emitter-switching device having in turn respective collector, source and gate terminals.

PRIOR ART

As it is well known, a so called emitter-switching circuit configuration comprises a connection of a bipolar transistor having a high breakdown voltage and of a low voltage power transistor MOSFET.

Figure 1:
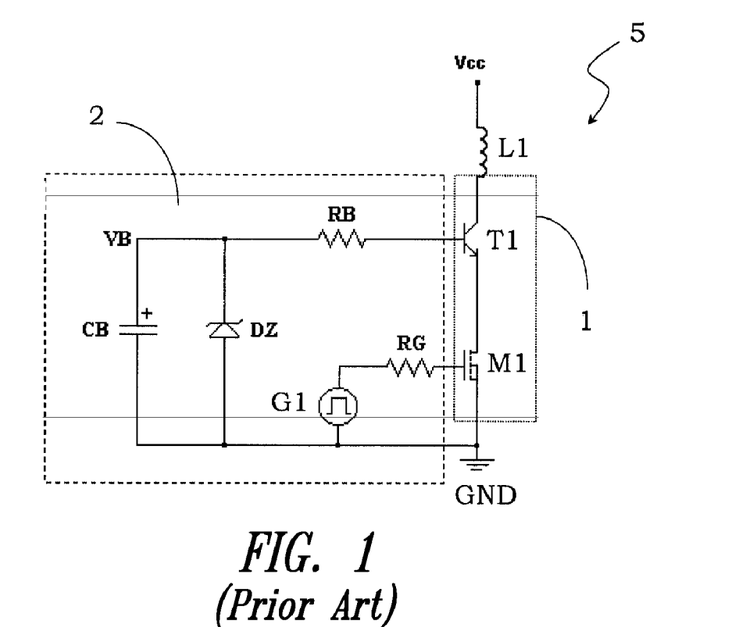
FIG. 1 schematically shows a first embodiment of a driving circuit for a configuration of the emitter-switching type realized according to the prior art.

Such a configuration is schematically shown in FIG. 1 and globally indicated with 1. The emitter-switching configuration 1 comprises a bipolar transistor T1 and a MOS transistor M1 inserted, in series with each other, between a first and a second voltage reference, in particular the supply voltage Vcc and the ground GND.

The emitter-switching configuration 1 provides that the bipolar transistor T1 is of the HV (High Voltage) type, i.e., a transistor with high breakdown voltage, while the MOS transistor M1 is of the LV (Low Voltage) type, i.e., a transistor with low breakdown voltage.

The bipolar transistor T1 has a collector terminal connected to the supply voltage reference Vcc through an inductive load L1 and a control or base terminal connected to a driving circuit 2.

The MOS transistor M1 has in turn a control or gate terminal connected to the driving circuit 2.

The driving circuit 2 comprises:
  a first resistive element RB connected to the base terminal of the bipolar transistor T1 and, through a diode Zener DZ, to the ground GND;
  a second resistive element RG connected to the gate terminal of the MOS transistor M1 and, through a voltage pulse generator G1, to the ground GND; and
  an electrolytic capacitor CB connected in parallel to the diode Zener DZ and having at its ends a voltage value equal to VB.

In particular, the electrolytic capacitor CB has the task of storing all the energy during the turn-off of the bipolar transistor T1, for re-using it during a successive turn-on and conduction step of the transistor itself, while the diode Zener prevents that the value of the base voltage of the bipolar transistor T1 exceeds a determined threshold.

The ensemble of the emitter-switching configuration 1 and of the driving circuit 2 forms a controlled emitter-switching device 5.

The emitter-switching configuration, known for long to the technicians of the field, is, at present, particularly interesting due to the presence on sale of bipolar transistors having a safety squared area RBSOA [Reverse Biased Safe Operating Area] (in emitter-switching configuration) at a current next to the peak one and at a voltage equal to the breakdown voltage BVCES between the collector and emitter terminals when the base terminal is short-circuited with the emitter terminal [Breakdown Voltage Collector-Emitter Short], as well as of power MOS transistors having a very low drain-source resistance value under conduction conditions, RDSON, and therefore almost serving as ideal switches.

The main advantages of the emitter-switching configuration are, as a matter of common knowledge, a very low voltage drop in conduction (typical of the bipolar transistors) and a high turn-off speed.

During the turn-off, in fact, the current flowing out from the base terminal of the bipolar transistor of the emitter-switching configuration is equal to the current of the collector terminal of this transistor, i.e., a very high current. This determines a drastic reduction both of the storage time and of the fall time, allowing the emitter-switching configuration to operate also up to frequencies of 150 kHz.

The driving carried out by means of the driving circuit 2 is very useful and efficient in all those cases in which the current in the emitter-switching configuration 1 is void, or very low with respect to the nominal one, in the turn-on step.

Figure 2:
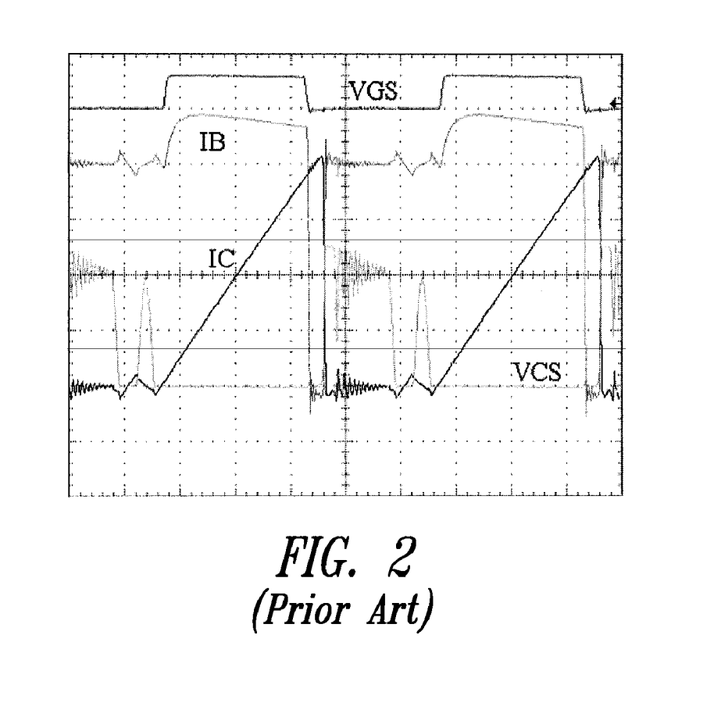
FIG. 2 shows the progress of waveforms characteristic of a flyback converter of the discontinuous type comprising the known driving circuit shown in FIG. 1.

FIG. 2 shows the progress of the values of the voltage VGS between gate and source terminals of the MOS transistors M1, of the voltage between the collector terminal of the bipolar transistor T1 and the source terminal of the MOS transistor M1, VCS, and of the base and collector currents of the bipolar transistor T1 with reference to a converter of the flyback type operating at a frequency of 100 kHz and shows a void turn-on current since the converter operates in a discontinuous way.

When one works with applications wherein the value of the current on the turn-on device is not void, and at relatively high frequencies (>60 kHz), dealing with a bipolar device, the phenomenon of the dynamic $V_{CESAT}$ (saturation voltage between collector and emitter terminals of the bipolar transistor T1) is revealed. This phenomenon consists in that, at the turn-on, there exists a certain delay before reaching the static voltage value $V_{CESAT}$, and it is thus necessary to flood with carriers the base region of the bipolar transistor as quickly as possible to make the value of the voltage $V_{CESAT}$ decrease and reach, in the shortest time possible, the steady value.

For this region, with the driving circuit 2 of FIG. 1, an excessive dissipation at the turn-ON would be obtained due to the fact that the voltage drop between collector and emitter terminals of the bipolar transistor T1, $V_{CE}$, would take a relatively long time ($\geq 2$ μs) for reaching the saturation value, $V_{CESAT}$.

Always with reference to the controlled emitter-switching device 5 of FIG. 1, an increase of the base voltage, VB, would only partially reduce the problem of the dynamic $V_{CESAT}$ but would enormously worsen the performances at the turn-OFF.

Figure 3:
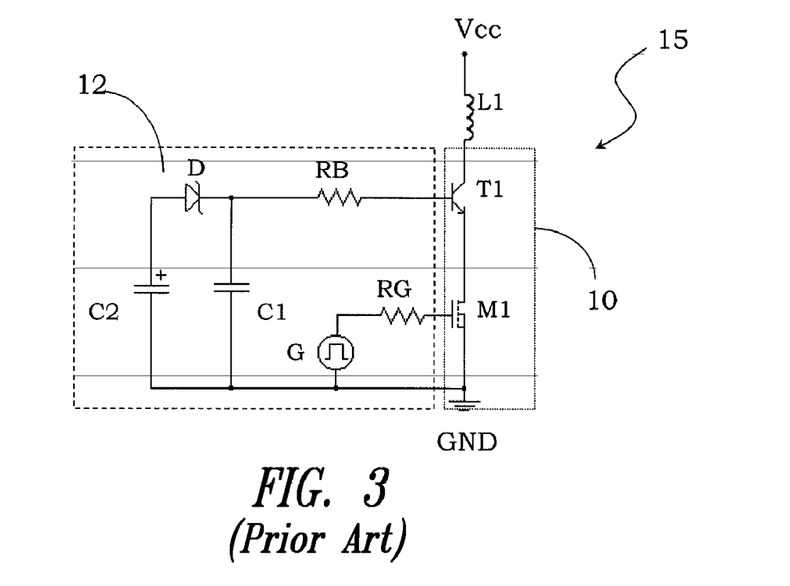
FIG. 3 schematically shows a second embodiment of a driving circuit for a configuration of the emitter-switching type realized according to the prior art.

A driving circuit suitable for the applications with a non-void collector current at the turn-ON has been the subject of a European patent application published with No. 1 455 452 on Sep. 8, 2004 to the same applicant and schematically shown in the annexed FIG. 3, globally indicated with 12. The driving circuit 12 is suitably connected to an emitter-switching configuration 10 to form a controlled emitter-switching device 15.

Figure 4:
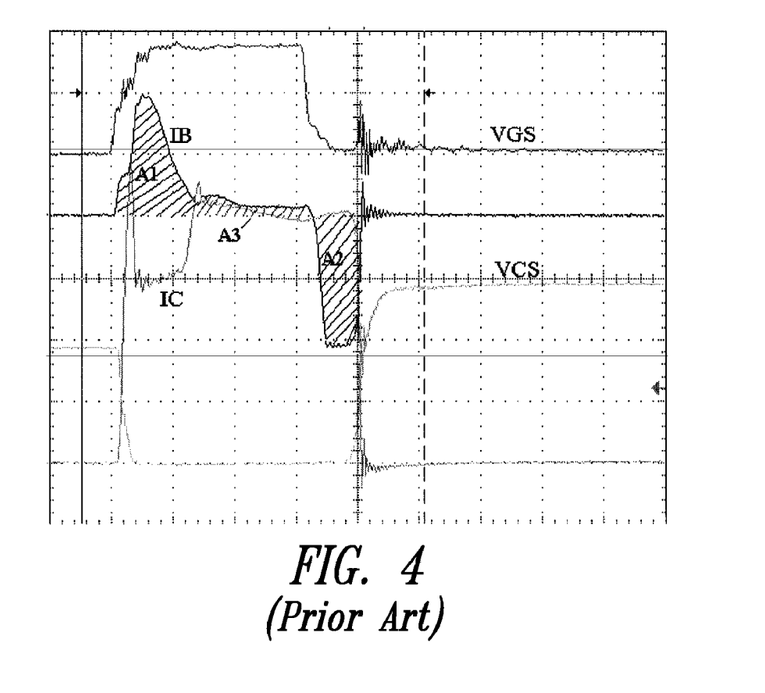
FIG. 4 shows the progress of waveforms obtained with the known driving circuit shown in FIG. 3.

The driving circuit 12 suitably modulates the base current optimizing both the switch steps and allowing the attainment of the minimum value of $V_{CESAT}$ in the shortest time possible. In the annexed FIG. 4, the waveforms referring to a forward converter operating at a frequency of 110 kHz are reported, where the modulation of the base current, IB can be observed.

The detailed operation and the sizing of the driving circuit 12 are widely discussed in the cited patent application.

Although advantageous under several viewpoints, this known driving circuit has known drawbacks especially highlighted when the need of applications with collector current of a variable value in a wide range is to be faced.

In these applications, the driving circuit 12, as described in the above indicated European patent application, must in fact be sized taking into account the most stressful operating condition, i.e., the highest collector current.

Thus, a correct saturation level should be ensured at the highest current value, suitably choosing a base voltage value VB' of the bipolar transistor T1, but in so doing, for low collector current values, the device operates under oversaturation conditions, obtaining extremely long storage times.

This implies an excessive dissipation at the turn-OFF, as well as a little accurate control due to the fact that the actual turn-off of the device occurs with a delay with respect to the signal supplied by a controller.

It is also possible to use more complex solutions comprising additional circuitries for the control of the storage time, through a modulation of the base current, IB.

In this case, however, specific designs of the base driving circuit are to be provided. The circuits to be obtained become difficult to be used at high current values and do not allow the connection of a recirculation diode between the collector and source terminals in the half-bridge and full-bridge configurations.

In fact the inductive recirculation current involves in this case a base circuit through a supply capacitance, discharging it and flowing after in the base-collector junction instead of flowing in the recirculation diode connected to the anode on the source terminal and the cathode on the collector terminal.

SUMMARY OF THE INVENTION

One embodiment is a driving circuit of an emitter-switching configuration for controlling the saturation level in applications which provide collector currents variable in a wide range, able to meet the above referred need and i.e., that of having a suitable saturation level under any operating condition, simultaneously overcoming, in a simple and efficient way, all the drawbacks cited with reference to the prior art.

One embodiment controls the saturation condition of the bipolar transistor of the emitter-switching configuration maintaining its base-collector junction at a voltage next to zero.

One embodiment is a driving circuit for an emitter-switching configuration of transistors having at least one first and one second control terminal connected to said driving circuit to form a controlled emitter-switching device having in turn respective collector, source and gate terminals, said driving circuit being wherein it comprises a driving block, inserted between a collector terminal and a source terminal of said controlled emitter-switching device and connected to said first control terminal of said emitter-switching configuration and in that said driving block comprises at least one IGBT driving device inserted between said collector terminal and said first control terminal of said emitter-switching configuration and having, in turn, a third control terminal as well as a driving bipolar transistor, inserted between said collector terminal and said first control terminal of said emitter-switching configuration and having, in turn, a fourth control terminal for a controlling a saturation condition of said bipolar transistor of said emitter-switching configuration maintaining a base-collector junction thereof at a voltage next to zero.

The characteristics and the advantages of some embodiments will be apparent from the following description of an embodiment thereof given by way of indicative and non limiting example with reference to the annexed drawings.

DETAILED DESCRIPTION

Figure 5A:
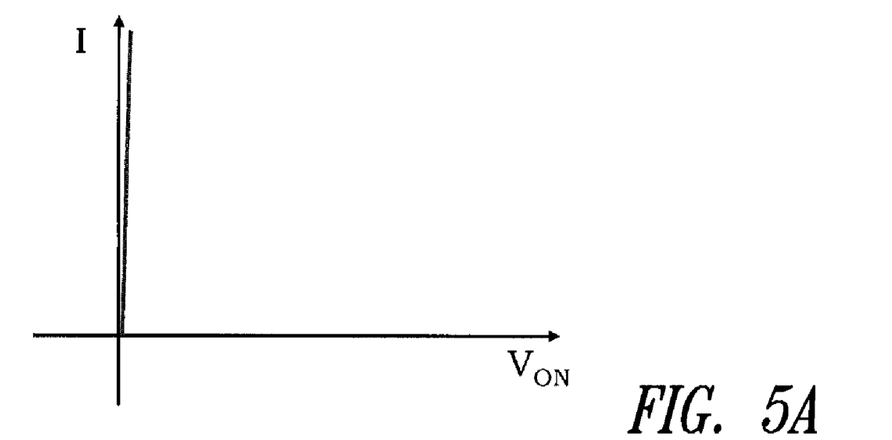
FIG. 5A show an ideal driving current-voltage characteristic [I-V] of a configuration of the emitter-switching type.

In a connection of the Darlington type, the driving circuit for an emitter-switching configuration should ideally have a current-voltage characteristic [I-V] of the type shown in FIG. 5A.

Figure 5B:
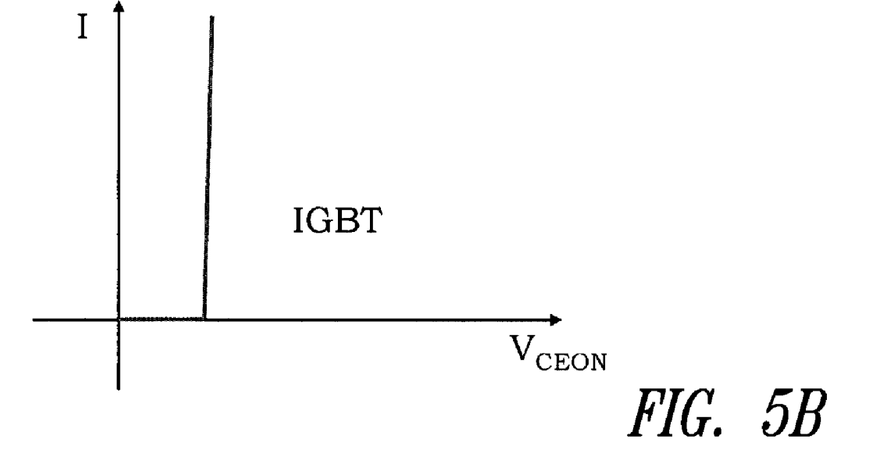
FIGS. 5B-5C show the progress of the current-voltage characteristics [I-V] of known electronic components, respectively IGBT and MOS.
Figure 5C:
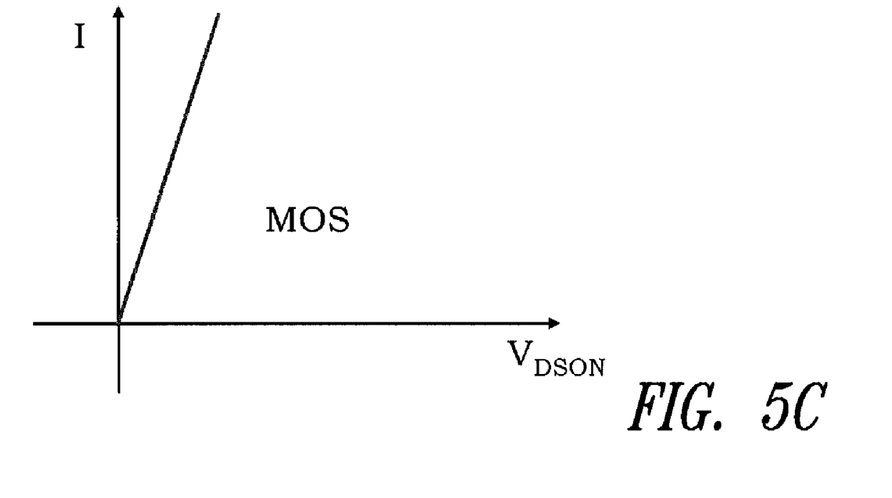

From a comparison of this ideal characteristic with the real characteristics I-V of an IGBT device and of a high voltage MOS device, shown in FIGS. 5B and 5C, respectively, it is immediate to verify that these known devices cannot meet the driving conditions requested.

In particular, the voltage drop in conduction of an IGBT device results in any case too high for obtaining the desired driving characteristic.

In the same way, by using a high voltage MOS device, the prior art resorts to elements with sizes on the silicon being ten times greater than the silicon area of the emitter-switching configuration itself.

It is however interesting to note that the differential resistance value reached in conduction by an IGBT device having sizes equal to ⅓ of the emitter-switching configuration coincides with the desired value of total resistance of the driver device.

Figure 6:
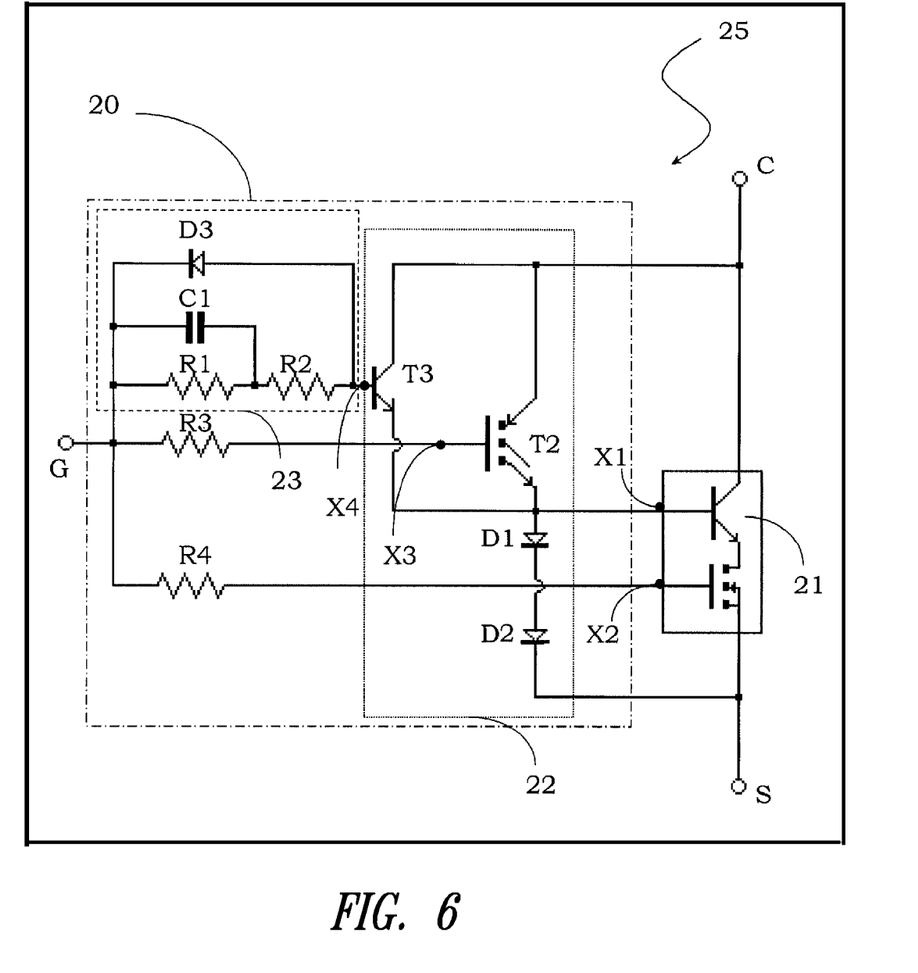
FIG. 6 schematically shows a driving circuit for a configuration of the emitter-switching type realized according to one embodiment.

Starting from these considerations, it is possible to consider a driving circuit 20 for an emitter-switching configuration 21 comprising at least one IGBT device T2 as driver in a connection of the Darlington type with the emitter-switching configuration 21, as shown in FIG. 6. In particular, the driving circuit 20 and the emitter-switching configuration 21 are connected to each other so as to realize a controlled emitter-switching device 25 having a collector terminal C, a source terminal S and a gate terminal G.

The emitter-switching configuration 21 comprises in a known way a cascode connection of a bipolar transistor having a high breakdown voltage and of a low voltage power transistor MOSFET and is coupled between the collector terminal C and the source terminal S. It also has a first control terminal X1 and a second control terminal X2, corresponding to the control terminals of the bipolar and MOSFET transistors, respectively, and connected to the driving circuit 20.

The driving circuit 20 comprises in turn a driving block, globally indicated with 22, coupled between the collector terminal C and the source terminal S and connected to the first control terminal X1 of the emitter-switching configuration 21.

In particular, the driving block 22 comprises the IGBT driving device T2 coupled between the collector terminal C and the first control terminal X1 of the emitter-switching configuration 21 and having in turn a third control terminal X3, in particular a gate terminal.

Advantageously, the driving block 22 further comprises a driving bipolar transistor T3, coupled between the collector terminal C and the first control terminal X1 of the emitter-switching configuration 21 and having, in turn, a fourth control terminal X4, in particular a base terminal.

The driving block 22 also comprises a first diode D1 and a second diode D2 serially connected between the first control terminal X1 of the emitter-switching configuration 21 and the source terminal S of the controlled emitter-switching device 25.

Suitably, the driving circuit 20 further comprises a biasing network 23 coupled between the fourth control terminal X4 of the driving bipolar transistor T3 and the gate terminal G of the controlled emitter-switching device 25.

In particular, the biasing network 23 comprises a first R1 and a second resistive element R2 coupled, in series with each other, between the gate terminal G and the fourth control terminal X4 of the driving bipolar transistor T3 as well as a capacitor C1, in turn coupled in parallel to the first resistive element R1, and a third diode D3, coupled between the fourth control terminal X4 of the driving bipolar transistor T3 and the gate terminal G of the controlled emitter-switching device 25.

Finally, the third control terminal X3 of the IGBT driving device T2 is connected to the gate terminal G of the controlled emitter-switching device 25 through a third resistive element R3 and the second control terminal X2 of the emitter-switching configuration 21 is connected to the gate terminal G of the controlled emitter-switching device 25 through a fourth resistive element R4.

Advantageously, the driving circuit 20 proposed obtains a control of the saturation condition of the bipolar transistor of the emitter-switching configuration 21 through the maintenance of the relative base-collector junction at a voltage next to zero. In particular, this control is realized in the mesh that is closed with the driving bipolar transistor T3.

It is immediate to verify that the voltage drop in conduction of the emitter-switching configuration 21 decreases to low values, respecting the condition of almost saturation necessary for a storage time being stable when the collector current Ic of the controlled emitter-switching device 25 varies.

In other words, by using the properties of almost saturation of the driving bipolar transistor T3, i.e., by maintaining the base-collector voltage always below its direct biasing, at a minimum value of inverted biasing voltage (in particular equal to the collector-emitter saturation voltage Vcesat of the driving bipolar transistor T3), a continuous control of the base current is obtained instant by instant when the collector current Ic of the emitter-switching configuration 21 varies and thus a storage time really stable under all conditions.

To better understand the principle whereon the controlled emitter-switching device 25 is based, its operation is now described.

During the turn-on step of the emitter-switching configuration 21, the dynamic saturation collector-source voltage $V_{CSSAT}$, quickly decreases thanks to the presence of the IGBT driving device T2, which is active in the first instants of the switch, as long as the collector-emitter voltage VceT2 at its ends is maintained higher than a limit value L1, equal to 0.7V.

In this turn-on step, the IGBT driving device T2 supplies the base terminal, i.e., the first control terminal X1, of the emitter-switching configuration 21 with a current peak Ipeak equal to a value necessary for having a good dynamic voltage $V_{CSSAT}$.

During the conduction step of the emitter-switching configuration 21 instead, the relative base current $I_B$ passes through the driving bipolar transistor T3, since when its collector-emitter voltage VceT3 is lower than the limit value L1, equal to 0.7V, the passage of current in the IGBT driving device T2 placed in parallel thereto is excluded.

The path of the current of the driving bipolar transistor T3 is then obliged in the base terminal of the emitter-switching configuration 21, since the potential of the anode of the first diode D1 is higher with respect to the potential of the base terminal of the emitter-switching configuration 21.

During the turn-off or switch step OFF of the emitter-switching configuration 21, after the simultaneous turn-off of the IGBT driving device T2 and of the bipolar transistor T3 (suitably chosen so as to be suitably fast) of the driving block 22, for the whole storage time, the current IBoff flows through the first and the second diode, D1 and D2 for closing then towards the source terminal S of the controlled emitter-switching device 25, connected to a voltage reference, for example to a ground GND.

It is also to be noted that, advantageously, in the controlled emitter-switching device 25, the base current Ib of the emitter-switching configuration 21 grows in a non linear way with respect to the growth of the collector current Ic.

In fact, this base current Ib follows the Hfe of the bipolar transistor of the emitter-switching configuration 21 which decreases when the collector current Ic increases. Then for maintaining the condition of almost saturation, this base current Ib must be with a higher and higher di/dt.

Advantageously, the condition of almost saturation is obtained by maintaining the base-collector junction of the emitter-switching configuration 21 at an inverted biasing imposed by the value of saturation collector-emitter voltage, $V_{CESAT}$, of the driving bipolar transistor T3 (equal to about 200 mV).

One embodiment is a control method of an emitter-switching configuration 21 having a first and a second control terminal, X1 and X2, the method providing to control a saturation condition of the bipolar transistor comprised in this emitter-switching configuration 21 maintaining a base-collector junction thereof at a voltage next to zero.

Advantageously, this method is implemented by a driving circuit 20 as previously described, in particular comprising at least one driving bipolar transistor T3. In particular, this driving bipolar transistor T3 is connected to the first control terminal X1 of the emitter-switching configuration 21 for controlling the saturation condition of the bipolar transistor contained therein. Suitably, this driving bipolar transistor T3 maintains the base-collector junction of the emitter-switching configuration 21 at an inverted biasing imposed by its saturation collector-emitter voltage value, $V_{CESAT}$ (equal to about 200 mV), controlling in this way the condition of almost saturation of the emitter-switching configuration 21.

The behavior of the controlled emitter-switching device 25 comprising the driving circuit 20 has been simulated by the Applicant. The results of these simulations are reported in FIG. 7 and in FIGS. 8A-8C.

Figure 7:
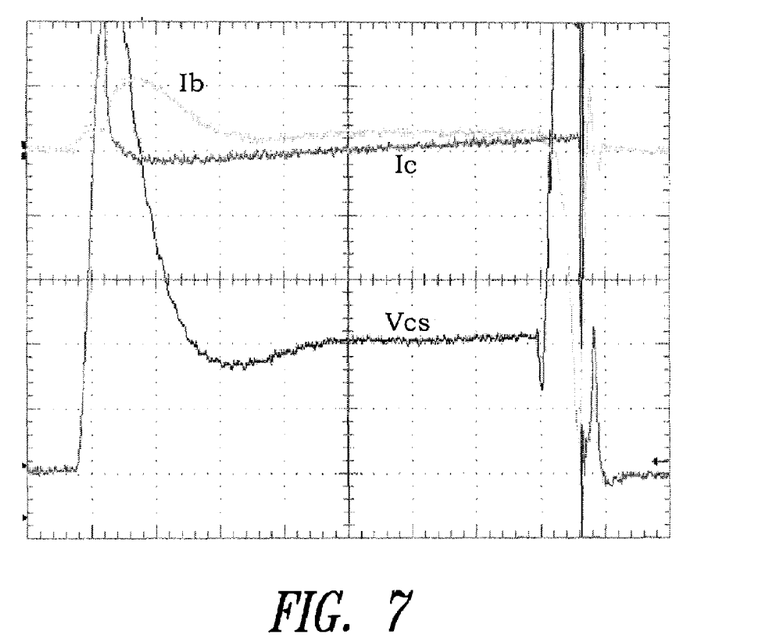
FIG. 7 shows the progress of waveforms obtained with the driving circuit realized according to one embodiment and shown in FIG. 6.
Figure 8A:
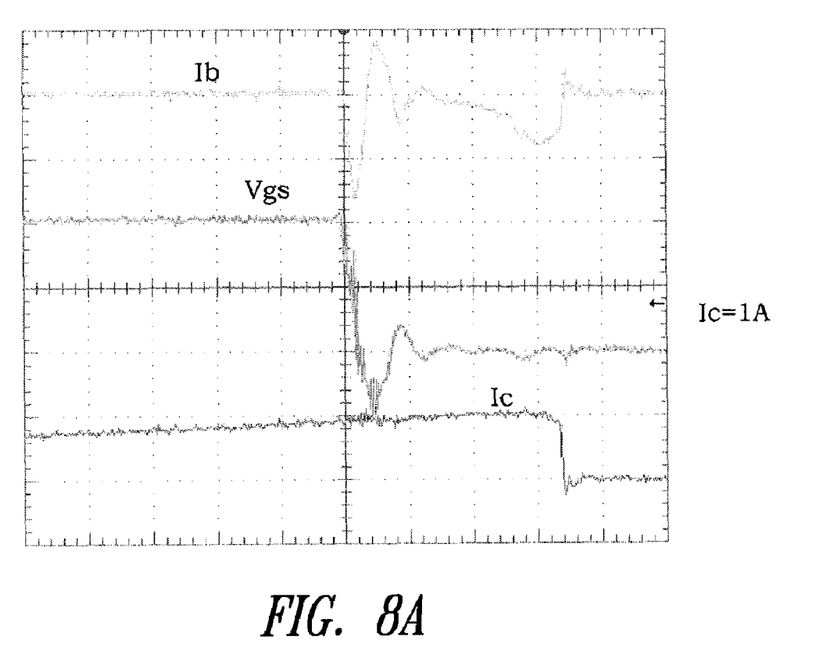
FIGS. 8A-8E show the progress of waveforms obtained with the driving circuit realized according to one embodiment and shown in FIG. 6 under different operating conditions of the same.
Figure 8B:
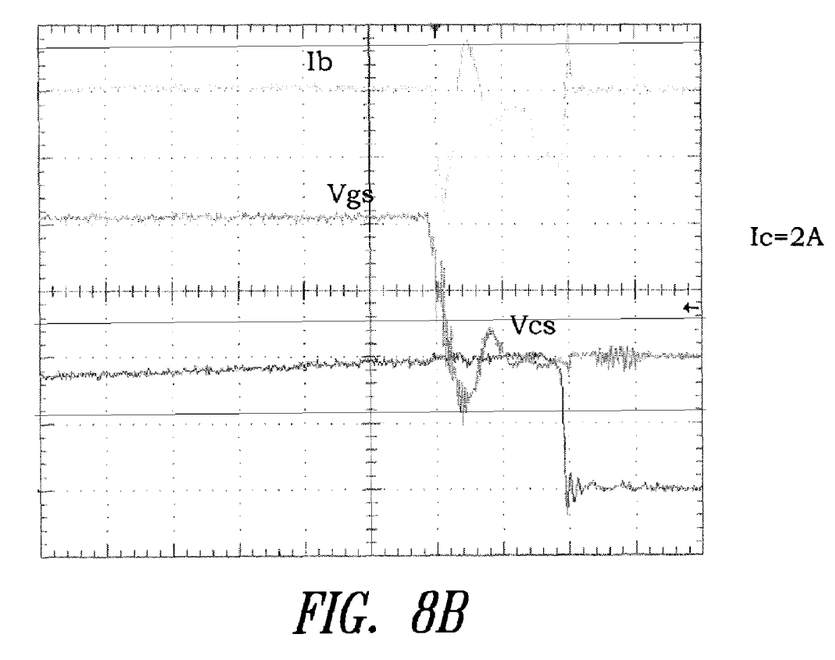
Figure 8C:
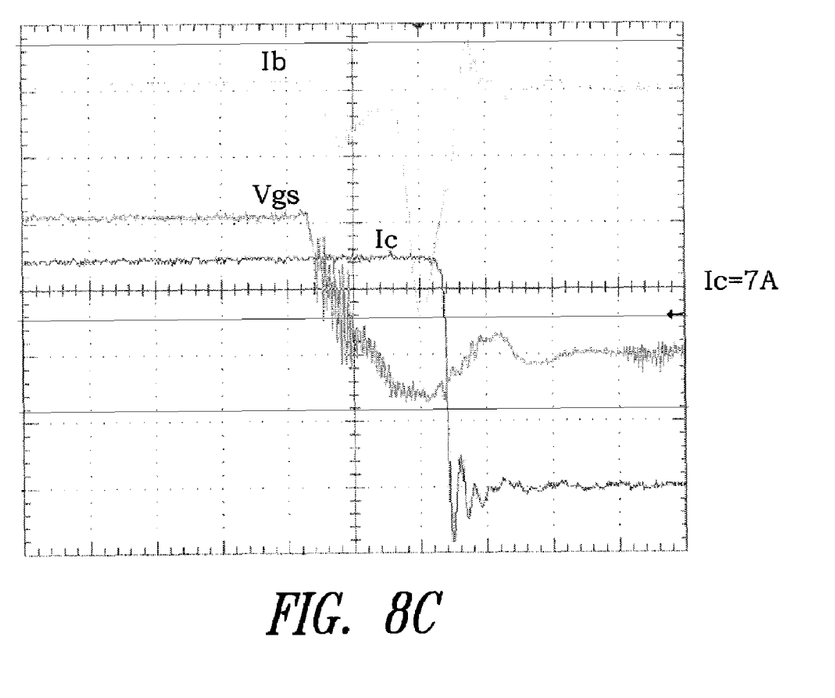
Figure 8D:
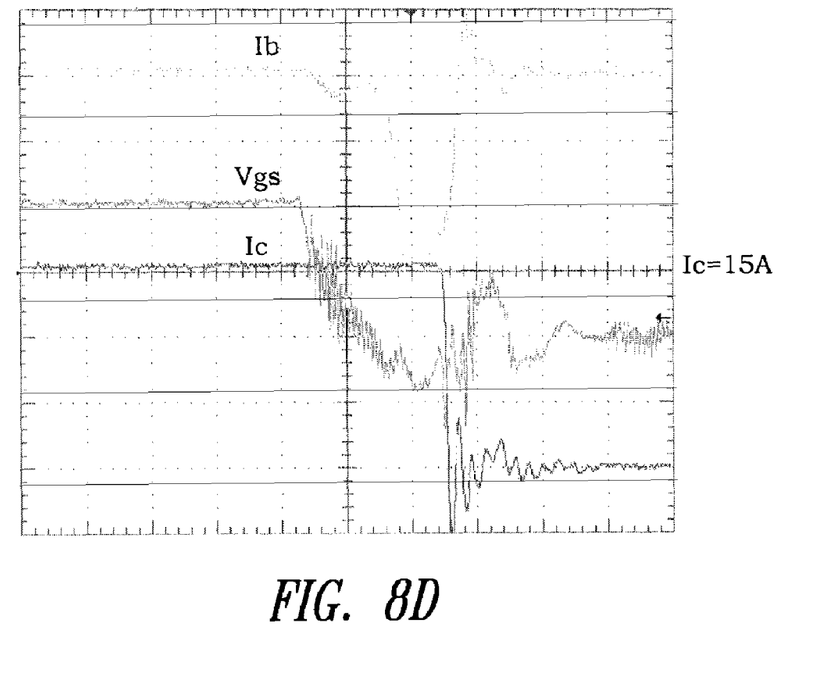

In particular, FIG. 7 shows the progress of the values of the voltage Vcs between the collector terminal of the bipolar transistor and the source terminal of the MOS transistor of the emitter-switching configuration 21 and of the base and collector currents, Ic and Ib, of this bipolar transistor with reference to a converter of the flyback type which operates at a frequency of 100 kHz and has a void turn-on current since the converter operates in a discontinuous way.

Figure 8E:
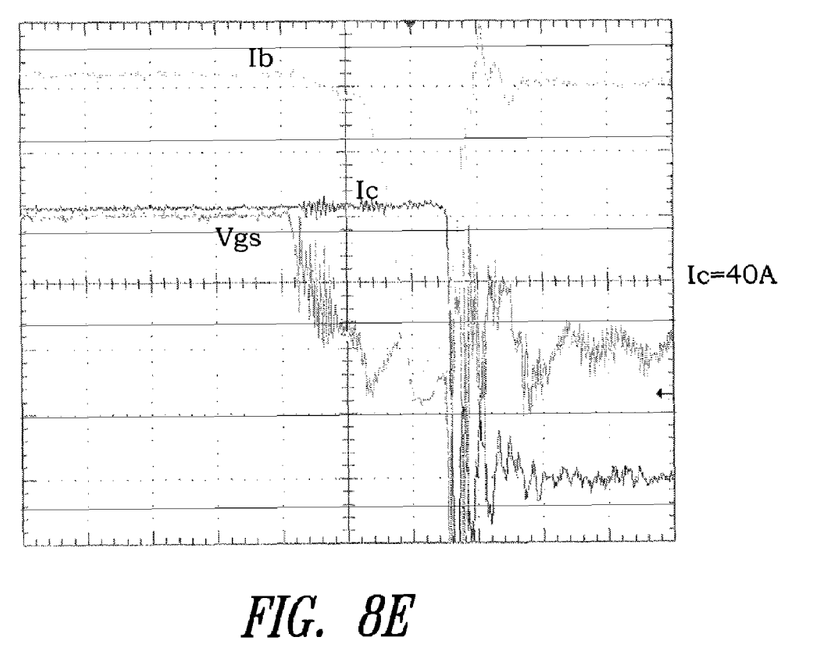

Moreover, FIGS. 8A-8E, show the progress of the base and collector currents, Ic and Ib, of the bipolar transistor comprised in the emitter-switching configuration 21 and of the voltage between the gate and source terminals of the further MOS transistor when the collector current Ic varies from a value equal to 1A (FIG. 8A) to a value equal to 40A (FIG. 8E). It is then possible to verify that the base current Ib of the controlled emitter-switching device 35 comprising the driving circuit 20 grows in a non-linear way with respect to the growth of the collector current Ic.

Figure 9:
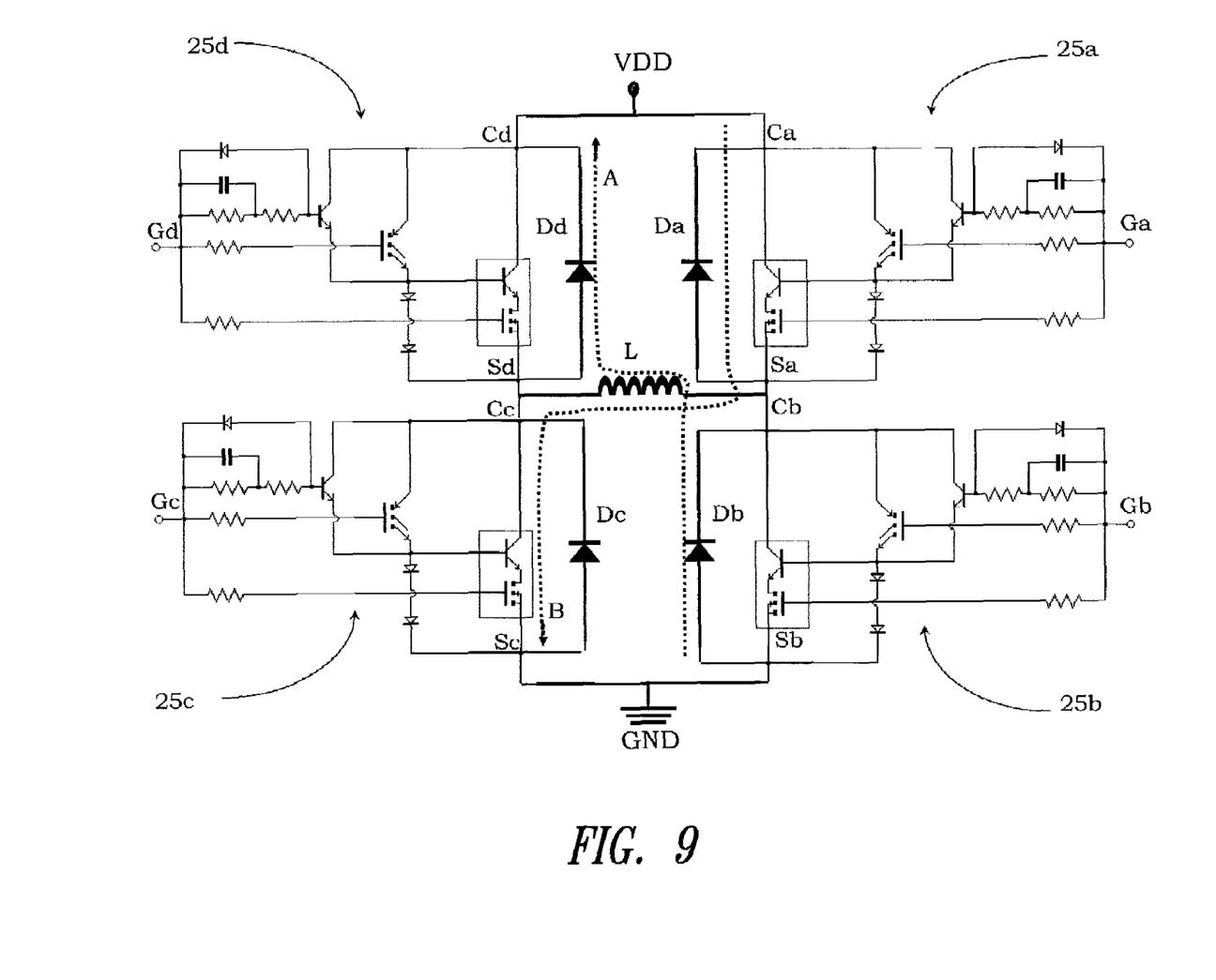
FIG. 9 schematically shows a full-bridge configuration comprising driving circuits of the type shown in FIG. 6.

In conclusion, it is suitable to remark that the controlled emitter-switching device 25 comprising the driving circuit 20 finds useful application in a full-bridge configuration with recirculation diodes on an inductive load, as schematically shown in FIG. 10.

In particular, the full-bridge configuration comprises four controlled emitter-switching devices 25a-25d having collector and source terminals connected to each other by respective recirculation diodes Da-Dd.

Differently from the known solutions, where there is always a supply capacitor between base terminal and ground reference which allows the passage of current in the base-collector junction of the bipolar transistor of the emitter-switching configuration 21, in the full-bridge configuration comprising driving circuits like the driving circuit 20 the only path allowed for the recirculation of the inductive current, after the opening of the switches of the circuits indicated with a and c, is through the recirculation diodes Dd and Db connected between the collector Cd and source Sb terminals (as indicated in FIG. 10 by the arrow A). Similarly, when the switches relative to the circuits indicated with d and b operate, the current circulates through the diodes Da and Dc connected between the collector Ca and source Sc terminals (as indicated in FIG. 10 by the arrow B).

In conclusion, the driving circuit allows to control the saturation level of a bipolar transistor of an emitter-switching configuration in applications providing collector currents variable in a wide range, attaining at the same time several advantages, among which the MOSFET and IGBT compatibility, a considerable structural simplicity which allows however the connection of a recirculation diode and has a low voltage drop in conduction. The driving circuit also ensures a storage time being stable when the collector current varies and a reduction of the dynamic voltage $V_{CSSAT}$.

Advantageously, the driving circuit 20 controls the emitter-switching configuration 21 in almost saturation and makes it possible the use of the recirculation diode.

Finally, the driving circuit 20 is easy to be driven and allows to optimize the safety area RBSOA [Reverse Biased Safe Operating Area].

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An emitter-switching device, comprising:
    collector, source and gate terminals;
    an emitter-switching configuration of transistors having a bipolar transistor and first and second control terminals; and
    a driving circuit coupled to the emitter-switching configuration and including a driving block, coupled between the collector terminal and the source terminal and coupled to said first control terminal of said emitter-switching configuration, wherein said driving block comprises:
        an IGBT driving device coupled between said collector terminal and said first control terminal of said emitter-switching configuration and having, in turn, a third control terminal; and
        a driving bipolar transistor coupled between said collector terminal and said first control terminal of said emitter-switching configuration, configured to control a saturation condition of said bipolar transistor of said emitter-switching configuration by maintaining a base-collector junction of the bipolar transistor of said emitter-switching configuration at substantially zero volts, and having a fourth control terminal.

2. An emitter-switching device according to claim 1, wherein said driving block further comprises first and second diodes serially coupled between said first control terminal of said emitter-switching configuration and said source terminal.

3. An emitter-switching device according to claim 2, further comprising a biasing network coupled between said fourth control terminal of said driving bipolar transistor and said gate terminal.

4. An emitter-switching device according to claim 3, wherein said biasing network comprises:
    a first and a second resistive element serially coupled between said gate terminal and said fourth control terminal;
    a capacitor coupled in parallel to said first resistive element; and
    a third diode coupled between said fourth control terminal and said gate terminal.

5. An emitter-switching device according to claim 4, further comprising a third resistive element coupled between said third control terminal of said IGBT driving device and said gate terminal.

6. An emitter-switching device according to claim 5, further comprising a fourth resistive element coupled between said second control terminal of said emitter-switching configuration and said gate terminal.

7. A method, comprising:
    controlling an emitter-switching configuration having a first and a second control terminal, the controlling including:
    controlling a saturation condition of a bipolar transistor comprised in said emitter-switching configuration; and
    maintaining a base-collector junction of the bipolar transistor at substantially zero volts,
    wherein controlling the saturation condition is implemented by a driving circuit connected to said first and second control terminals of said emitter-switching configuration and comprising a driving bipolar transistor coupled to said first control terminal of the emitter-switching configuration, and wherein said driving bipolar transistor maintains the base-collector junction of said emitter-switching configuration at an inverted bias imposed by a saturation collector-emitter voltage value of the bipolar transistor of the emitter-switching configuration.

8. A control method according to claim 7, wherein said driving circuit includes an IGBT driving device coupled between a collector terminal of the emitter-switching configuration and said first control terminal of said emitter-switching configuration and having, in turn, a third control terminal, wherein the driving bipolar transistor is coupled between said collector terminal and said first control terminal of said emitter-switching configuration, and is configured to control the saturation condition of said bipolar transistor of said emitter-switching configuration by maintaining the base-collector junction of the bipolar transistor of said emitter-switching configuration at substantially zero volts.

9. A device, comprising:
a load;
a first emitter-switching device coupled to the load and including:
a first emitter-switching configuration of transistors coupled between a first voltage terminal and the load, the first emitter-switching configuration having a first bipolar transistor and first and second control terminals; and
a first driving circuit coupled to the first emitter-switching configuration and including a first driving block coupled between the first voltage terminal and the load and coupled to said first control terminal of said first emitter-switching configuration, wherein said first driving block comprises:
a first IGBT driving device coupled between the first voltage terminal and said first control terminal of said first emitter-switching configuration and having, in turn, a third control terminal; and
a first driving bipolar transistor coupled between said first voltage terminal and said first control terminal of said first emitter-switching configuration, configured to control a saturation condition of said bipolar transistor of said first emitter-switching configuration by maintaining a base-collector junction of the bipolar transistor of said first emitter-switching configuration at substantially zero volts, and having a fourth control terminal.

10. A device according to claim 9, wherein said driving block further comprises first and second diodes serially coupled between said first control terminal of said emitter-switching configuration and said load.

11. A device according to claim 10, wherein the first emitter-switching device includes a biasing network coupled between said fourth control terminal of said driving bipolar transistor and a gate terminal of the first emitter-switching device.

12. A device according to claim 11, wherein said biasing network comprises:

a first and a second resistive element serially coupled between said gate terminal and said fourth control terminal;
a capacitor coupled in parallel to said first resistive element; and
a third diode coupled between said fourth control terminal and said gate terminal.

13. A device according to claim 12, wherein the first emitter-switching device includes a third resistive element coupled between said third control terminal of said IGBT driving device and said gate terminal.

14. A device according to claim 13, wherein the first emitter-switching device includes a fourth resistive element coupled between said second control terminal of said first emitter-switching configuration and said gate terminal.

15. A device according to claim 9, further comprising:
a second emitter-switching device coupled to the load and including:
a second emitter-switching configuration of transistors coupled between a second voltage terminal and the load, the second emitter-switching configuration having a second bipolar transistor and fifth and sixth control terminals;
a second driving circuit coupled to the second emitter-switching configuration and including a second driving block coupled between the second voltage terminal and the load and coupled to said fifth control terminal of said second emitter-switching configuration, wherein said second driving block comprises:
a second IGBT driving device coupled between the load and said fifth control terminal of said second emitter-switching configuration and having, in turn, a third control terminal;
a second driving bipolar transistor coupled between said load and said fifth control terminal of said second emitter-switching configuration, and configured to control a saturation condition of said second bipolar transistor of said second emitter-switching configuration by maintaining a base-collector junction of the second bipolar transistor of said second emitter-switching configuration at substantially zero volts.

16. A device according to claim 15 wherein the first and second emitter-switching devices are coupled to one another at a first terminal of the load, the device further comprising:
a third emitter-switching device coupled between the first voltage terminal and a second terminal of the load; and
a fourth emitter-switching device coupled between the second voltage terminal and the second terminal of the load.

17. A device according to claim 16, wherein the load is a coil, the device further comprising:
first, second, third, and fourth recirculation diodes coupled in parallel with the first, second, third, and further emitter switching devices, respectively.

* * * * *